United States Patent [19]

Walls et al.

[11] Patent Number: 4,780,392
[45] Date of Patent: Oct. 25, 1988

[54] RADIATION-POLYMERIZABLE COMPOSITION AND ELEMENT CONTAINING A PHOTOPOLYMERIZABLE ACRYLIC MONOMER

[75] Inventors: John E. Walls, Hampton; Carlos Tellechea, Shrewsbury; Major S. Dhillon, Belle Mead, all of N.J.

[73] Assignee: Hoechst Celanese Corporation, Somerville, N.J.

[21] Appl. No.: 762,010

[22] Filed: Aug. 2, 1985

[51] Int. Cl.$^4$ .......................... G03C 1/70; G03C 1/68
[52] U.S. Cl. .................................. 430/288; 430/281; 430/909; 522/120; 522/121; 522/63
[58] Field of Search ....................... 430/909, 288, 281; 522/120, 121, 63

[56] References Cited

U.S. PATENT DOCUMENTS

| | | | |
|---|---|---|---|
| 2,245,218 | 6/1941 | Murray et al. | 91/69 |
| 2,269,217 | 1/1942 | McNally et al. | 260/73 |
| 2,278,895 | 4/1942 | Rugeley et al. | 28/1 |
| 2,405,523 | 8/1946 | Sease | 95/7 |
| 3,390,993 | 7/1968 | Borchers | 96/36.4 |
| 3,396,019 | 8/1968 | Ulig | 96/33 |
| 3,471,589 | 10/1969 | Rinehart | 260/839 |
| 3,514,421 | 5/1970 | Kershaw et al. | 260/29.6 |
| 3,552,965 | 1/1971 | Notley et al. | 96/48 |
| 3,653,902 | 4/1972 | Notley et al. | 96/49 |
| 3,679,419 | 7/1972 | Gillich | 96/91 R |
| 3,801,328 | 4/1974 | Takimoto et al. | 96/115 P |
| 3,847,614 | 11/1974 | Mattor | 96/75 |
| 3,867,147 | 2/1975 | Teuscher | 96/33 |
| 3,905,815 | 9/1975 | Bonham | 96/68 |
| 3,905,819 | 9/1975 | Sakurai et al. | 96/35.1 |
| 3,926,918 | 12/1975 | Shibata et al. | 260/73 L |
| 3,954,475 | 5/1976 | Bonham et al. | |
| 3,963,618 | 6/1976 | Muir | 526/9 |
| 4,002,796 | 1/1977 | Baldi et al. | 428/375 |
| 4,115,232 | 9/1978 | Nyi et al. | |
| 4,147,549 | 4/1979 | Held | 96/85 |
| 4,228,232 | 10/1980 | Rousseau | 430/271 |
| 4,289,838 | 9/1981 | Rowe et al. | 430/163 |
| 4,316,949 | 2/1982 | Petrellis et al. | 430/159 |
| 4,387,151 | 6/1983 | Bosse et al. | 430/175 |
| 4,413,091 | 11/1983 | Iwasaki et al. | 430/195 X |

FOREIGN PATENT DOCUMENTS

| | | |
|---|---|---|
| 1144804 | 4/1983 | Canada . |
| 1153236 | 9/1983 | Canada . |
| 156015 | 6/1981 | Japan . |
| 078272 | 1/1982 | Japan . |
| 005910 | 11/1982 | Japan . |
| 196656 | 6/1983 | Japan . |
| 7410806 | 2/1976 | Netherlands . |
| 0518757 | 7/1976 | U.S.S.R. . |
| 482731 | 6/1936 | United Kingdom . |
| 484476 | 5/1938 | United Kingdom . |
| 497146 | 12/1938 | United Kingdom . |
| 568914 | 4/1945 | United Kingdom . |
| 587797 | 5/1947 | United Kingdom . |
| 621784 | 4/1949 | United Kingdom . |
| 821092 | 9/1959 | United Kingdom . |
| 834337 | 5/1960 | United Kingdom . |
| 1352411 | 4/1971 | United Kingdom . |

OTHER PUBLICATIONS

Kirk-Othmar, "Encyclopedia of Polymer Science & Technology", vol. 14, pp. 208-213, 217-230, 1971.

Primary Examiner—Paul R. Michl
Assistant Examiner—Cynthia Hamilton
Attorney, Agent, or Firm—Richard S. Roberts

[57] ABSTRACT

This invention relates to a radiation polymerizable composition for use in a photographic element such as a lithographic printing plate comprising in admixture
(a) a binder resin having the general formula

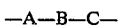

wherein a plurality of each of components A, B and C occur in ordered or random sequence in the resin and wherein A is present in said resin at about 5% to about 20% by weight and comprises groups of the formula

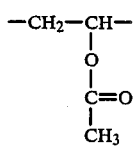

B is present in said resin at about 4% to about 30% by weight and comprises groups of the formula

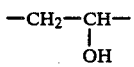

and C is present in said resin at about 50% to about 91% by weight and comprises acetal groups consisting of groups of the formulae

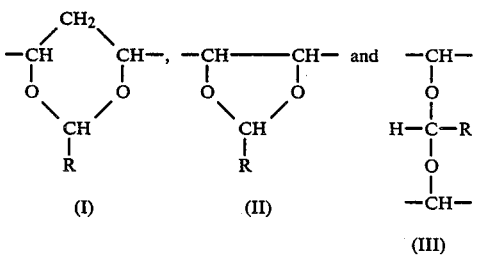

where R is lower alkyl or hydrogen, and wherein said group I is present in component C from about 75% to about 85%, group II is present in component C from about 3% to about 5%; and group III is present in component C from about 10% to about 22%;
(b) a photoinitiator; and
(c) an acrylic monomer having one or more unsaturated groups.

15 Claims, No Drawings

RADIATION-POLYMERIZABLE COMPOSITION AND ELEMENT CONTAINING A PHOTOPOLYMERIZABLE ACRYLIC MONOMER

BACKGROUND OF THE INVENTION

The present invention relates to a radiation-polymerizable composition. More particularly, this invention relates to a radiation-polymerizable composition which may be employed to produce an improved photographic element such as a lithographic printing plate. Such plates show an increase of stability and press run life. The composition can be readily formed into adherent coatings useful in the graphic arts especially in the production of lithographic printing plates.

The use of radiation polymerizable coatings in the graphic arts is well known. Typically, the composition of such coatings can include a polymeric constituent, which may itself be radiation polymerizable, and a photosensitizer composition. Upon selected exposure of this coating to imaging energies, the radiation polymerizable species within the composition would either itself undergo a reaction or promote a reaction or degradation of one or more of the other components of the composition. It is, of course, readily appreciated that such reaction is only of value in such a system where it is essentially confined, or limited, to those areas of the composition impinged upon by such imaging energies. A negative working image thus created within the coating can then be "developed" by selective removal of the non-exposed components of the film or layer which have not been subjected to imaging energies. The ability to create such selective changes in coatings prepared from a radiation polymerizable composition has been appreciated for some time. The basic difference in the various approaches in the formulation of lithographic printing plates from radiation polymerizable compositions has been in the search for a system which is prepared from relatively inexpensive ingredients, does not require prolonged imaging energies (has a high quantum efficiency), is able to undergo an increased number of press runs, results in the creation of high resolution images within the composition which can be manifested without prolonged and elaborate development and, most significantly, may be developed with a composition which does not necessarily contain organic solvents and need only contain a minimal amount of salts and surfactants.

Most such lithographic printing plates comprise a metal substrate which is coated with a light sensitive diazonium compound in admixture with suitable binding resins, photoinitiators, photopolymerizable compositions, colorants, stabilizers, exposure indicators, surfactants and the like.

Although the art is replete with photosensitive compositions which may be used for lithographic printing plates, the prior art composition's serviceability is restricted by their limited stability and number of press runs.

SUMMARY OF THE INVENTION

This invention relates to a radiation polymerizable composition for use in forming photographic elements such as lithographic printing plates, comprising in admixture as the base coating (a) a binder resin having the general formula

—A—B—C— wherein a plurality of each of components A, B and C occur in ordered or random sequence in the resin and wherein A is present in said resin at about 5% to about 20% by weight and comprises groups of the formula

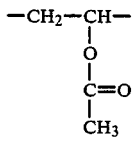

B is present in said resin at about 4% to about 30% by weight and comprises groups of the formula

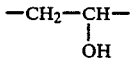

and C is present in said resin at about 50% to about 91% by weight and comprises acetal groups consisting of groups of the formulae

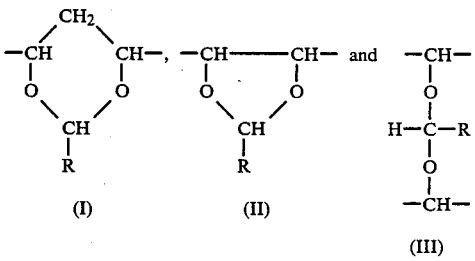

where R is lower alkyl or hydrogen, and wherein said group I is present in component C from about 75% to about 85%, group II is present in component C from about 3% to about 5%; and group III is present in component C from about 10% to about 22%;

(b) a photoinitiator; and
(c) an acrylic monomer having one or more unsaturated groups.

The invention further provides a photographic element comprising a substrate, the foregoing composition coated on the substrate, and a transparent, continuous, oxygen barrier film disposed on said composition.

DETAILED DESCRIPTION OF THE INVENTION

This invention relates to a radiation-polymerizable composition. More particularly, this invention relates to a radiation-polymerizable composition for use in printing photographic elements such as lithographic printing plates, which comprises in admixture as the base coating (a) a binder resin having the general formula

—A—B—C— wherein a plurality of each of components A, B and C occur in ordered or random sequence in the resin and wherein A is present in said resin at about 5% to about 20% by weight and comprises groups of the formula

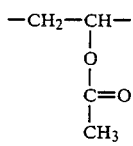

B is present in said resin at about 4% to about 30% by weight and comprises groups of the formula

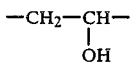

and C is present in said resin at about 50% to about 91% by weight and comprises acetal groups consisting of groups of the formulae

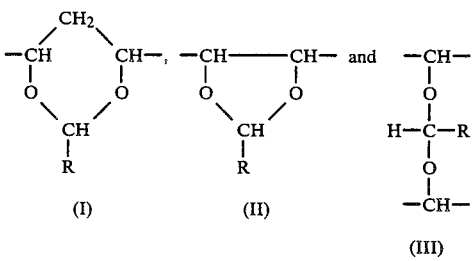

where R is lower alkyl or hydrogen, and wherein said group I is present in component C from about 75% to about 85%, group II is present in component C from about 3% to about 5%; and group III is present in component C from about 10% to about 22%;

(b) a photoinitiator; and (c) an acrylic monomer having one more unsaturated groups.

As used in describing the resin which may be used in this invention, the term "lower alkyl" refers to a straight or branched chain hydrocarbon having from 1 to 8 carbon atoms and containing no unsaturation.

The polyvinyl alcohol/polyvinyl acetate copolymers suitable for use as a starting material for the production of the resin useful in this invention are those having from about 75% to about 80% hydrolization by weight and, preferably, an average molecular weight (AMW) of from about 5,000 to about 100,000. As used in this application hydrolization is on a weight basis and not a mole basis. Such copolymers are easily synthesized by methods known to those skilled in the art, or are commercially available. Suitable copolymers include Vinol 523 (AMW$\approx$70,000) and Vinol 205 (AMW$\approx$26,000) available from Air Products Co. of Allentown, Penn.; Elvanol 52-22 (AMW$\approx$72,000) available from DuPont of Wilmington, Del.; and Gelvatol 20-30 (AM$\approx$10,000), Gelvatol 20-60 (AMW$\approx$60,000) and Gelvatol 20-90 (AMW$\approx$90,000) available from Monsanto Co. of St. Louis, Mo. Preferably, the copolymer has an average molecular weight in the range of about 50,000 to about 100,000.

In forming the resin of this invention, the copolymer is first dissolved in a solvent mixture of water and a hydroxyl group containing solvent. The hydroxyl group containing solvent must be miscible with water, it must be a solvent for the copolymer, and it must be a solvent for the final product. Preferably, the hydroxyl group containing solvent is an aliphatic alcohol. Most preferably, the alcohol is one having from about 1 to 4 carbon atoms such as ethanol. In order to ensure that the copolymer molecules of the starting material are not so intertwined with each other nor having tertiary or quaternary structure to the extent that the reaction is interfered with to a substantial degree, the copolymer is preferably dissolved in the solvent mixture for at least 12 hours at elevated temperature (preferably above 50° C.) before the reaction proceeds. This reaction mixture is then maintained at a temperature of at least 50° C. and mixed with vigorous agitation which continues throughout the reaction. Over a period of several hours, an aliphatic aldehyde is then titrated into the reaction mixture to form the acetal groups.

The process steps for preparing the foregoing resin include first dissolving a polyvinyl alcohol/polyvinyl acetate copolymer having from about 75% to about 80% hydrolization in a solvent mixture of water and a hydroxyl-group containing solvent to form a reaction solution. This is usually conducted for at least about 12 hours at a temperature of from about 20° C. to the boiling point of the solution depending on the molecular weight of the copolymer. The solution is then adjusted to at least about 50° C. while adding a catalytic amount, preferably from about 1.0% to about 1.5% by weight of an organic sulfonic or inorganic mineral acid. This is a catalytic amount of the acid and is insufficient to cause hydrolization. Titrated into the acidified mixture is an aliphatic aldehyde having the formula R—CHO, wherein R is hydrogen or lower alkyl. The aldehyde is added in an amount sufficient to produce a degree of acetal formation of from about 50% to about 91% by weight. During this titration an additional amount of said hydroxyl group containing solvent is added into said reaction mixture to prevent unwanted precipitation. Preferably one vigorously mixes said reaction mixture throughout the foregoing steps. Preferably the acid is then removed from the mixture by evaporation or the mixture is neutralized with an alkaline salt to a pH of from about 6.5 to 7.5 to quench said reaction mixture. One then effects precipitation of said reaction mixture; washes the precipitate with water; and dries the precipitate so as to have less than about 1% water residue.

The preferred aldehyde is one having the formula R—CHO, wherein R is hydrogen or lower alkyl. Most preferably the aldehyde is acetaldehyde or propionaldehyde. For use in the production of a lithographic printing plate, propionaldehyde is preferred. The amount of aldehyde titrated into the reaction mixture is preferably from about 25% to about 100% by weight of the copolymer. More preferably the amount of aldehyde is from about 28% to about 67% by weight of the copolymer.

As the acetal groups are formed at the expense of the hydroxyl content of the copolymer, the water solubility is reduced. In order to prevent premature precipitation of the product formed, additional amounts of the hydroxyl group containing solvent used in the solvent mixture are titrated simultaneously with the aldehyde to accomodate the Product's reduced water solubility and increasing solvent solubility.

In order to properly form the acetal groups, a catalytic amount of an acid is required to be present during the titrations. Preferably the acid used is an inorganic mineral acid or an organic sulfonic acid. Suitable inorganic mineral acids include hydrochloric acid, sulfuric acid and phosphoric acid. Suitable organic sulfonic acids include p-toluene sulfonic acid and stilbene disulfonic acid. Most preferably, the acid catalyst is hydrochloric acid. The acid catalyst is preferably present in the reaction mixture in the amount of from about 1.0% to about 1.5% by weight of the total reaction mixture.

After the titrations are completed, the reaction mixture is neutralized with an alkaline salt in order quench the reaction mixture so as to prevent the deacetalization which may otherwise occur. The neutralization should adjust the pH of the reaction mixture to about 6.5 to about 7.5, and should preferably be 7.0. Suitable alkaline salts for the neutralization include sodium carbonate, potassium carbonate, sodium hydroxide and potassium hydroxide, with sodium carbonate being the most preferred.

After neutralization, the reaction mixture is preferably, although not necesssarily, cooled to room temperature (about 22° to 25° C.) and then slowly mixed with water or other suitable compositions such as acetone or methyl ethyl ketone with continued vigorous agitation to effect precipitation. The resulting precipitate is water washed to remove all remaining acid, aldehyde and unreacted copolymer, and is then warm air dried so as to have less than 1% water residue.

The resulting resin contains acetal groups consisting of three types: six-membered cyclic acetals which are present from about 75% to 85%, five-membered cyclic acetals which are present from about 3% to 5% and intermolecular acetals which are present from about 10% to 22%. It is important for the use of this resin that all three types of acetal groups are present and in their indicated concentrations. This resin is more fully described in U.S. patent application Ser. No. 762,089, filed on even date herewith, and which is incorporated herein by reference.

Preferably, the polymeric binder is present in the composition at a percent solids level of from about 20% to about 75% by weight. A more preferred range is from about 30% to about 65% by weight and, most preferably, the polymeric binder is present at a percent solids level of from about 35% to about 50% by weight. Suitable photoinitiators which may be used in this invention are preferably those free-radical photoinitiators having a maximum aborption range of from about 320 to about 400 nm. Examples include the acetophenones, benzophenones, triazines, benzoins, benzoin ethers, xanthones, thioxanthones, acridenes and benzoquinones. More preferred of these are the triazines having the formula

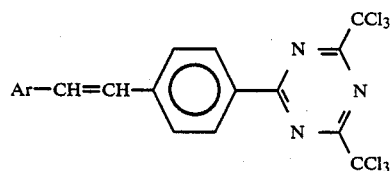

wherein Ar is

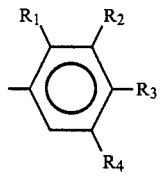

and $R_1$, $R_2$, $R_3$ and $R_4$ are, independently, hydrogen, chlorine, bromine, alkoxy, alkyl ketone, naphthyl or anthracyl, especially bis-trichloromethyl triazine. The most preferred photoinitiator is 2-stilbenyl-4,6-di(trichloromethyl)triazine. The photoinitiator is preferably present in the composition at a percent solids level of about 1.5% to about 8.0% by weight, more preferably about 2.0% to about 6.0% by weight and is most preferably present at a percent solids level of from about 3.0% to about 4.0% by weight.

The photopolymerizable component of the subject invention is an acrylic monomer which has one or more unsaturated groups. The acrylic monomer is an ethylenically unsaturated compound having acrylate or methacrylate esters and being capable of reacting with itself upon exposure to imaging radiation. The preferred monomer is either a solid or liquid having a viscosity of greater than about 700 cps at 25° C., preferably greater than about 2000 cps at 25° C. Most preferably, the monomer has a viscosity of greater than about 4000 cps at 25° C.

Examples of compounds which are suitable for use as the acrylic monomer of this invention include trimethylol propane triacrylate and the ethoxylated or propoxylated analogs thereof, trimethylol propane tri-methacrylate and the ethoxylateed or propoxylated analogs thereof, pentaerythritol triacrylate, pentaerythritol trimethacrylate, dipentaerythritol monohydroxy pentaacrylate, dipentaerythritol monohydroxy pentamethacrylate, dipentaerythritol hexaacrylate, dipentaerythritol hexamethacrylate, pentaerythritol tetracrylate and pentaerythritol tetramethylacrylate, trimethylol propane monoacrylate and the ethoxylated or propoxylated analogs thereof, trimethylol propane monomethacrylate and the ethoxylated or propoxylated analogs thereof, pentaerythritol acrylate, pentaerythritol methacrylate, tetrahydro furfuryl acrylate, tetrahydro furfuryl methacrylate, cyclohexyl acrylatee, cyclohexyl methacrylate, n-hexyl acrylate, n-hexyl methacrylate, glycidyl acrylate and glycidyl methacrylate. Preferably, the monomer is dipentaerythritol monohydroxy pentaacrylate.

The monofunctional monomer is an ethylenically unsaturated compound having one unsaturated group and is capable of reacting with the polyfunctional monomer upon exposure to imaging radiation. The monofunctional monomer is characterized as having the unsaturated group being an acrylate or methacrylate ester. Preferably, the monofunctional monomer is a liquid having a viscosity in the range of from about 1 to about 25 cps at 25° C.

The photopolymerizable acrylic monomer is present at a percent solids level which is preferably in the range of from about 20% to about 70% by weight. More preferably, the photopolymerizable acrylic monomer is present at a percent solids level of from about 30% to about 60% by weight and most preferably from about 30% to about 50% by weight.

One of the significant aspects of this invention is that the photosensitive composition produced thereby may be developed with a composition which does not necessarily contain any organic solvents and which need only contain a minor amount of salts and surfactants. There is a great advantage in the elimination of organic solvents in the developer composition due to the fact that such solvents are expensive and their effluent is toxic. Another of the advantages in having a polyfunctional monomer in the photopolymerizable mixture in combination with a monofunctional monomer is that the 3-dimensional structure provided by the polyfunctional monomer provides good matrix integrity allowing for a tough image and the linear propagation provided by the monofunctional monomer provides good photospeed. If the photopolymerizable mixture was comprised of two polyfunctional acrylic monomers, the resulting image would have good toughness but poor photospeed. If the mixture was comprised of two monofunctional acrylic monomers, there would be good photospeed but poor image toughness.

Other components which may be included in the radiation-polymerizable composition of this invention include acid stabilizers, exposure indicators, plasticizers, photoactivators and colorants.

Suitable acid stabilizers useful within the context of this invention include phosphoric, citric, benzoic, m-nitro benzoic, p(p-anilino phenylazo)benzene sulfonic acid, 4,4'-dinitro-2,2'-stilbene disulfonic, itaconic, tartaric and p-toluene sulfonic acid, and mixtures thereof. Preferably, the acid stabilizer is phosphoric acid. When used, the acid stabilizer is preferably present in the radiation-polymerizable composition in the amount of from about 0.3% to about 2.0%, and most preferably from about 0.75% to about 1.5%, although the skilled artisan may use more or less as desired.

Exposure indicators (or photoimagers) which may be useful in conjunction with the present invention include 4-phenylazodiphenylamine, eosin, azobenzene, Calcozine Fuchine dyes and Crystal Violet and Methylene Blue dyes. Preferably, the exposure indicator is 4-phenylazodiphenylamine. The exposure indicator, when one is used, is preferably present in the composition in an amount of from about 0.001% to about 0.0035% by weight. A more preferred range is from about 0.002% to about 0.030% and, most preferably, the exposure indicator is present in an amount of from about 0.005% to about 0.20%, although the skilled artisan may use more or less as desired.

The photoactivator which may be included in the composition of this invention should be an amine-containing photoactivator which combines synergistically with the free-radical photoinitiator in order to extend the effective half-life of the photoinitiator, which is normally in the approximate range of about $10^{-9}$ to $10^{-15}$ seconds. Suitable photoactivators include 2-(N-butoxy)ethyl-4-dimethylamino benzoate, 2-(dimethylamino)amino benzoate and acrylated amines. Preferably the photoactivator is ethyl-4-dimethylamino benzoate. The photoactivator is preferably present in the composition of this invention in an amount of from about 1.0% to about 4.0% by weight, although the skilled artisan may use more or less as desired.

A plasticizer may also be included in the composition of this invention to prevent coating brittleness and to keep the composition pliable if desired. Suitable plasticizers include dibutylphthalate, triarylphosphate and substituted analogs thereof and, preferably, dioctylphthalate. The plasticizer is preferably present in the composition of this invention in an amount of from about 0.5% to about 1.25% by weight, although the skilled artisan may use more or less as desired.

Colorants useful herein include dyes such as Rhodamine, Calcozine, Victoria Blue and methyl violet, and such pigments as the anthraquinone and phthalocyanine types. Generally, the colorant is present in the form of a pigment dispersion which may comprise a mixture of one or more pigments and/or one or more dyes dispersed in a suitable solvent or mixture of solvents. When a colorant is used, it is preferably present in the composition of this invention in an amount of from about 1.5% to about 4.0% by weight, more preferably from about 1.75% to about 3.0% and most preferably from about 2.0% to about 2.75%, although the skilled artisan may use more or less as desired.

In order to form a coating composition for the production of lithographic printing plates, the composition of this invention may be dissolved in admixture in a solvent or mixture of solvents to facilitate application of the composition to the substrate. Suitable solvents for this purpose include water, tetrahdrofuran, butyrolactone, glycol ethers such as propylene glycol monomethyl ether and methyl cellosolve, alcohols such as ethanol and n-propanol, and ketones such as methyl ethyl ketone, or mixtures thereof. Preferably, the solvent comprises a mixture of tetrahydrofuran, propylene glycol monomethyl ether and butyrolactone. In general, the solvent system is evaporated from the coating composition once it is applied to an appropriate substrate, however, some insignificant amount of solvent may remain as residue.

The foregoing describes the components, and solvents for said components, useful in preparing a radiation polymerizable base coating. In the production of free-radical initiated photopolymerizable coatings, it is widely recognized that such reactions are subject to a quenching phenomenon by triplet oxygen of the free radical formed by irradiating the initiator. The premature return of the free-radicals to the energy ground state precludes the required energy transfer necessary to effect the polymerization reaction.

An art recognized method useful in preventing triplet oxygen quenching of radiation formed free-radicals is overcoating the base coating with a water-soluble polymeric resin. Preferably such resins must be transparent, film-forming polymers which substantially act as oxygen barrier layers and which are inert and incompatible with all ingredients comprising the base coating, and be soluble in water or mixtures of water and solvents.

Examples of polymers which are suitable for use as an overcoat producing polymer for the purpose of this invention include polyvinyl alcohol, polyvinyl alcohol/polyvinyl acetate copolymer, polyvinyl pyrrolidone, polyvinyl pyrrolidone/polyvinyl acetate copolymer, polyacrylic acid, poly(butadiene-maleic acid), polyvinyl methyl ether and poly butyl acrylic acid.

Substrates useful for coating with the composition of this invention to form a lithographic printing plate include sheets of transparent films such as polyester, aluminum and its alloys and other metals, silicon and similar materials which are well known in the art. Preferably, the substrate comprises aluminum. The substrate may first be pretreated by standard graining and/or etching and/or anodizing techniques as are well known in the art, and also may or may not have been treated with a composition such as polyvinyl phosphonic acid, sodium silicate or the like suitable for use as a hydrophilizing agent.

In the production of photographic elements such as lithographic printing plates, an aluminum substrate is first preferably grained by art recognized methods such as by means of a wire brush, a slurry of particulates or by chemical and electrochemical means, for example in an electrolyte solution comprising hydrochloric acid. The grained plate is preferably then anodized for example in sulfuric or phosphoric acid in a manner well known in the art. The grained and optionally anodized surface is preferably then rendered hydrophilic by treatment with polyvinyl phosphonic acid by means which are also known to the skilled artisan. The thusly prepared plate is then coated with the composition of the present invention, preferably at a coating weight of from about 0.6 g/m² to about 2.5 g/m², more preferably from about 0.8 g/m² to about 2.0 g/m² and most preferably from about 1.2 g/m² to about 1.5 g/m², although these coating weights are not critical to the practice of this invention, and dried. The thusly coated plate is then overcoated with an aqueous solution of the polymeric film-forming resin and dried. The preferred coating weight ranges from about 0.5 g/m² to about 6.0 g/m², more preferably from about 0.75 g/m² to about 4.0 g/m² and most preferably from about 1.0 g/m² to about 2.5 g/m², although these coating weights are not critical to the practice of this invention.

Preferably the thusly prepared lithographic printing plate is exposed to actinic radiation through a negative test flat so as to yield a solid 6 on a 21 step Stouffer exposure wedge after development. The exposed plate is then developed with a suitable aqueous developer composition, developer such as one comprising one or more of the following groups:

(a) a sodium, potassium or lithium salt of octyl, decyl or dodecyl monosulfate;
(b) a sodium, lithium, potassium or ammonium metasilicate salt; and
(c) a lithium, potassium, sodium or ammonium borate salt; and
(d) an aliphatic dicarboxylic acid, or sodium, potassium or ammonium salt thereof having from 2 to 6 carbon atoms; and
(e) mono, di-, or tri-sodium or -potassium phosphate.

Other suitable developers include water, benzoic acid or sodium, lithium and potassium benzoates and the hydroxy substituted analogs thereof as well as those developers described in U.S. Pat. No. 4,436,807. In conventional use, the developed plate is finished with a subtractive finisher, such as a hydrophilic polymer. Examples include cold water-soluble dextrin and/or polyvinyl pyrrolidone, a nonionic surfactant, a humectant, an inorganic salt and water, as taught by U.S. Pat. No. 4,213,887.

For the purpose of improving the press performance of a plate prepared as described above, it is known that baking of the exposed and developed plate can result in an increase in the number of quality impressions over that otherwise obtainable. To properly bake the plate, it is first treated with a solution designed to prevent loss of hydrophilicity of the background during baking. An example of an effective solution is disclosed in U.S. Pat. No. 4,355,096, the disclosure of which is hereby incorporated herein by reference. The thusly prepared plate is then heat treated by baking at a temperature of from about 180° C. up to the annealing temperature of the substrate, most preferably about 240° C. The effective baking time is inversely proportional to the temperature and averages in the range of from about 2 to about 15 minutes. At 240° C. the time is about 7 minutes.

The following examples are illustrative of the invention but it is understood that the invention is not limited thereto.

In each of the following examples, the binder resin used is a binder resin having the general formula

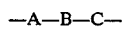

wherein a plurality of each of components A, B and C occur in ordered or random sequence in the resin and wherein A is present in said resin at about 5% to about 20% by weight and comprises groups of the formula

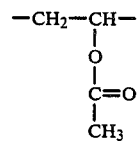

B is present in said resin at about 4% to about 30% by weight and comprises groups of the formula

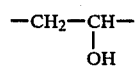

and C is present in said resin at about 50% to about 91% by weight and comprises acetal groups consisting of groups of the formulae

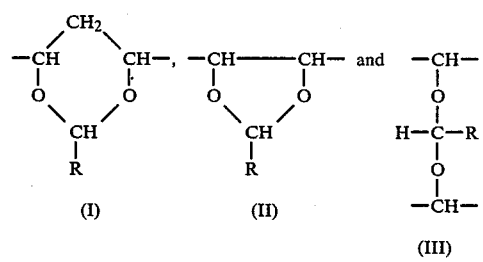

where R is lower alkyl or hydrogen, and wherein said group I is present in component C from about 75% to about 85%, group II is present in component C from about 3% to about 5%; and group III is present in component C from about 10% to about 22%.

EXAMPLE 1

An 8"×25" section of lithographic grade 1100 aluminum alloy is degreased with an aqueous alkaline degreasing solution and electrochemically grained using 900 coulombs of alternating current in a medium of nitric acid and aluminum nitrate. The grained plate is well rinsed and anodized in a sulfuric acid bath wherein the aluminum is made anodic. Sufficient current and voltage is used to produce an oxide layer of 2.8 g/m². The anodized plate is well rinsed and hydrophilized by immersing the plate into a solution of polyvinyl phosphonic acid. The plate is well rinsed and dried. The thusly prepared plate is whirler coated with a solution having the following composition:

|  | % w/w |
| --- | --- |
| Binder resin formed by reacting 75.0 g of Vinol 523, a polyvinyl alcohol/polyvinyl acetate copolymer which has from about 75% to 80% hydroxyl groups by weight and an average molecular weight of about 70,000, and is dissolved in a solution comprising 225.0 g of water and 200.0 g of ethanol for 16 hours at 70° C. after which 10.13 g of hydrochloric acid (37%) is added and the temperature adjusted to 60° C. while mixing vigorously with 37.66 g of propionaldehyde. Using standard analytical techniques this product is found to consist of 13.6% acetate, 9.8% hydroxyl and 76.6% acetal groups. Of the acetal groups, 80% are found to be six-membered cyclic acetal, 4% are five-membered cyclic acetal, and 16% are intermolecular acetals. | 4.54 |
| Pentaerythritol tetraacrylate | 4.02 |
| 2-Stilbenyl-4,6-di(trichloromethyl)triazine | 3.20 |
| Methyl cellosolve | 88.24 |
|  | 100.00 |

The coated and dried plate is then whirl coated with a solution having the following composition:

|  | % w/w |
| --- | --- |
| polyvinyl alcohol | 2.0 |
| ethanol | 45.0 |
| water | Balance |

The coated and dried plate is exposed to actinic radiation through a negative exposure flat so as to yield a solid seven on a 21 step Stouffer step wedge. The plate is developed using the following composition which has a pH of 7.3:

|  | % w/w |
| --- | --- |
| sodium benzoate | 6.9 |
| sodium octyl sulfate | 3.0 |
| trisodium phosphate | 2.8 |
| monosodium phosphate | 1.5 |
| $H_2O$ | Balance | and finished with the following composition

|  | % w/w |
| --- | --- |
| Dextrin*** | 5.52 |
| sodium octyl sulfate | 1.61 |
| Triton X-100**** | 1.00 |
| Givgaurd DXN***** | 0.05 |
| $H_3PO_4$ | 2.37 |
| $H_2O$ | Balance |

***hydrolyzed tapioca dextrin
****isooctyl phenol polyoxyethylene ethanol; 4.5 moles ethylene oxide
*****1,4-dimethyl-6-acetoxy-dioxane and run on a Heidelberg sheet fed press using abrasive ink, over-packing, and a Dahlgren dampening system until image breakdown is achieved. Under these conditions the plate provides 255,000 acceptable impressions.

EXAMPLE 2

An 8"×25" section of lithographic grade 1100 aluminum alloy is degreased with an aqueous alkaline degreasing solution and electrochemically grained using 900 coulombs of alternating current in a medium of nitric acid and aluminum nitrate. The grained plate is well rinsed and anodized in a sulfuric acid bath wherein the aluminum is made anodic. Sufficient current and voltage is used to produce an oxide layer of 2.8 g/m². The anodized plate is well rinsed and hydrophilized by immersing the plate into a solution of polyvinyl phosphonic acid. The plate is well rinsed and dried. The thusly prepared plate is whirler coated with a solution having the following composition:

|  | % w/w |
| --- | --- |
| Binder resin formed by reacting 40.0 g of Gelvatol 20-60, a polyvinyl alcohol/polyvinyl acetate copolymer which has from about 75% to 80% hydroxyl groups by weight and an average molecular weight of about 60,000, and is dissolved in a solution comprising 120.0 g of water and 120.0 g of ethanol for 16 hours at 70° C. after which 10.13 g of hydrochloric acid (37%) are added and the temperature is adjusted to 60° C. while mixing vigorously with 27.41 g of hexanal. Using standard analytical techniques the product is found to consist of 15.2% acetate, 7.6% hydroxyl and 77.2% acetal groups. Of the acetal groups, 80% are found to be six-membered cyclic acetal, 4% are five-membered cyclic acetal, and 16% are intermolecular acetals. | 4.54 |
| Dipentaerythritol monohydroxy pentaacrylate | 4.02 |
| 2-Stilbenyl-4,6-di(trichloromethyl)triazine | 3.20 |
| Methyl cellosolve | 88.24 |
|  | 100.00 |

The coated and dried plate is then whirl coated with a solution having the following composition:

|  | % w/w |
| --- | --- |
| polyvinyl alcohol | 2.0 |
| ethanol | 45.0 |
| water | Balance |

The coated and dried plate is exposed to actinic radiation through a negative exposure flat so as to yield a solid seven on a 21 step Stouffer step wedge. The plate is developed using the following composition which has a pH of 7.3:

|  | % w/w |
| --- | --- |
| sodium benzoate | 6.9 |
| sodium octyl sulfate | 3.0 |
| trisodium phosphate | 2.8 |
| monosodium phosphate | 1.5 |
| $H_2O$ | Balance | and finished with the following composition

|  | % w/w |
| --- | --- |
| Dextrin*** | 5.52 |
| sodium octyl sulfate | 1.61 |
| Triton X-100**** | 1.00 |
| Givgaurd DXN***** | 0.05 |
| $H_3PO_4$ | 2.37 |
| $H_2O$ | Balance |

***hydrolyzed tapioca dextrin
****isooctyl phenol polyoxyethylene ethanol; 4.5 moles ethylene oxide
*****1,4-dimethyl-6-acetoxy-dioxane and run on a Heidelberg sheet fed press using abrasive ink, over-packing, and a Dahlgren dampening system until image breakdown is achieved. Under these conditions the plate provides 240,000 acceptable impressions.

EXAMPLE 3

An 8"×25" section of lithographic plate 1100 aluminum alloy is degreased with an aqueous alkaline degreasing solution and electrochemically grained using 900 coulombs of alternating current in a medium of nitric acid and aluminum nitrate. The grained plate is well rinsed and anodized in a sulfuric acid bath werein the aluminum is made anodic. Sufficient current and voltage is used to produce an oxide layer of 2.8 g/m². The anodized plate is well rinsed and hydrophilized by immersing the plate into a solution of polyvinyl phosphonic acid. The plate is well rinsed and dried. The thusly prepared plate is whirler coated with a solution having the following composition:

| | % w/w |
|---|---|
| Binder resin formed by reacting 75.0 g of Elvanol 52-22 a polyvinyl alcohol/polyvinyl acetate copolymer which has from about 75% to 80% hydroxyl groups by weight and an average molecular weight of about 90,000, and is dissolved in a solution comprising 225.0 g of water and 220.0 g of ethanol for 16 hours at 70° C. after which 10.13 g of hydrochloric acid (37%) are added and the temperature adjusted to 60° C. while mixing vigorously with 28.62 g of acetaldehyde. Using standard analytical techniques the product is found to consist of 17.2% acetate, 13.6% hydroxyl and 69.2% acetal groups. Of the acetal groups, 80% are found to be six-membered cyclic acetal, 4% are five-membered cyclic acetal, and 16% are intermolecular acetals. | 4.54 |
| Pentaerythritol acrylate | 4.02 |
| 2-Stilbenyl-4,6-di(trichloromethyl)triazine | 3.20 |
| Methyl cellosolve | 88.24 |
| | 100.00 |

The coated and dried plate is then whirl coated with a solution having the following composition:

| | % w/w |
|---|---|
| polyvinyl alcohol | 2.0 |
| ethanol | 45.0 |
| water | Balance |

The coated and dried plate is exposed to actinic radiation through a negative exposure flat so as to yield a solid seven on a 21 step Stouffer step wedge. The plate is developed using the following composition which has a pH of 7.3:

| | % w/w |
|---|---|
| sodium benzoate | 6.9 |
| sodium octyl sulfate | 3.0 |
| trisodium phosphate | 2.8 |
| monosodium phosphate | 1.5 |
| H$_2$O | Balance | and finished with the following composition

| | % w/w |
|---|---|
| Dextrin*** | 5.52 |
| sodium octyl sulfate | 1.61 |
| Triton X-100**** | 1.00 |
| Givgaurd DXN***** | 0.05 |
| H$_3$PO$_4$ | 2.37 |
| H$_2$O | Balance |

***hydrolyzed tapioca dextrin
****isooctyl phenol polyoxyethylene ethanol; 4.5 moles ethylene oxide
*****1,4-dimethyl-6-acetoxy-dioxane and run on a Heidelberg sheet fed press using abrasive ink, over-packing, and a Dahlgren dampening system until image breakdown is achieved. Under these conditions the plate provides 210,000 acceptable impressions.

We claim:

1. A radiation-polymerizable composition comprising in admixture
   (a) a binder resin having the general formula $$-A-B-C-$$

wherein a plurality of each of components A, B and C occur in ordered or random sequence in the resin and wherein A is present in said resin at about 5% to about 20% by weight and comprises groups of the formula

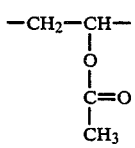

B is present in said resin at about 4% to about 30% by weight and comprises groups of the formula

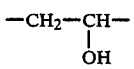

and C is present in said resin at about 50% to about 91% by weight and comprises acetal groups consisting of groups of the formulae

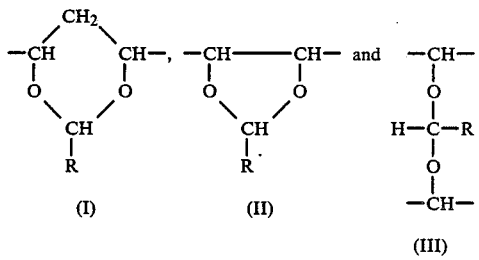

where R is lower alkyl or hydrogen, and wherein said group I is present in component C from about 75% to about 85%, group II is present in component C from about 3% to about 5%; and group III is present in component C from about 10% to about 22%;

(b) a photoinitiator; and
(c) an acrylic monomer having one or more unsaturated groups.

2. The composition of claim 1 wherein said acrylic monomer is an ethylenically unsaturated compound having from 2 to 6 unsaturated groups.

3. The composition of claim 2 wherein said acrylic monomer is further characterized as having the unsaturated groups being acrylate or methacrylate esters.

4. The composition of claim 3 wherein said acrylic monomer is pentaerythritol tetraacrylate.

5. The composition of claim 1 wherein said acrylic monomer is an ethylenically unsaturated aliphatic compound.

6. The composition of claim 1 wherein said acrylic monomer is further characterized as having the unsaturated group be an acrylate or methacrylate ester.

7. The composition of claim 6 wherein said acrylic monomer is pentaerythritol acrylate.

8. The composition of claim 1 wherein said acrylic monomer is present in said composition in an amount of from about 20% to about 70% by weight.

9. The composition of claim 8 wherein said acrylic monomer is present in said composition in an amount of from about 30% to about 60% by weight.

10. The composition of claim 1 wherein R is ethyl.

11. The composition of claim 1 wherein said photoinitiator comprises a triazine compound.

12. The composition of claim 11 wherein said photoinitiator comprises a bis-trichloromethyl triazine having the formula

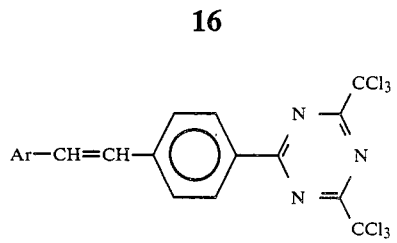

wherein Ar is

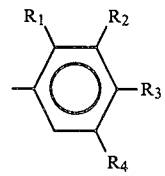

and $R_1$, $R_2$, $R_3$ and $R_4$ are, independently, hydrogen, chlorine, bromine, alkoxy, alkyl ketone, naphthyl or anthracyl.

13. The composition of claim 12 wherein said photoinitiator is 2-stilbenyl-4,6-di(trichlormethyl)triazine.

14. The composition of claim 1 wherein R is ethyl.

15. The composition of claim 1 wherein R is methyl.

* * * * *